United States Patent
Jang et al.

(10) Patent No.: US 12,122,914 B2
(45) Date of Patent: Oct. 22, 2024

(54) SILICONE BACK PLATE FOR FLEXIBLE DISPLAY

(71) Applicant: DOW SILICONES CORPORATION, Midland, MI (US)

(72) Inventors: Seunghyun Jang, Chungcheongbuk-do (KR); Jongchan Park, Chungcheongbuk-do (KR)

(73) Assignee: DOW SILICONES CORPORATION, Midland, MI (US)

( * ) Notice: Subject to any disclaimer, the term of this patent is extended or adjusted under 35 U.S.C. 154(b) by 987 days.

(21) Appl. No.: 17/054,326

(22) PCT Filed: May 9, 2019

(86) PCT No.: PCT/US2019/031511
§ 371 (c)(1),
(2) Date: Nov. 10, 2020

(87) PCT Pub. No.: WO2019/217672
PCT Pub. Date: Nov. 14, 2019

(65) Prior Publication Data
US 2021/0108080 A1    Apr. 15, 2021

Related U.S. Application Data

(60) Provisional application No. 62/670,184, filed on May 11, 2018.

(51) Int. Cl.
| | | |
|---|---|---|
| C08L 83/04 | (2006.01) | |
| G06F 1/16 | (2006.01) | |
| H10K 77/10 | (2023.01) | |
| C08G 77/12 | (2006.01) | |
| C08G 77/20 | (2006.01) | |
| H10K 102/00 | (2023.01) | |

(52) U.S. Cl.
CPC ............ *C08L 83/04* (2013.01); *G06F 1/1652* (2013.01); *H10K 77/111* (2023.02); *C08G 77/12* (2013.01); *C08G 77/20* (2013.01); *H10K 2102/311* (2023.02)

(58) Field of Classification Search
CPC ................................. C08G 77/12; C08G 77/20
See application file for complete search history.

(56) References Cited

U.S. PATENT DOCUMENTS

| 4,845,164 A | 7/1989 | Gutek |
|---|---|---|
| 9,540,551 B2 | 1/2017 | Okawa et al. |
| 2005/0006794 A1 | 1/2005 | Kashiwagi et al. |
| 2008/0160322 A1 | 7/2008 | Mochizuki et al. |
| 2011/0288246 A1 | 11/2011 | Hasegawa et al. |
| 2011/0294950 A1 | 12/2011 | Hasegawa et al. |
| 2012/0065343 A1 | 3/2012 | Bahadur et al. |
| 2013/0264007 A1 * | 10/2013 | Noishiki ................ D21H 15/02 |
| | | 427/372.2 |
| 2014/0275384 A1 | 9/2014 | Takahashi |
| 2015/0021570 A1 | 1/2015 | Kim et al. |
| 2015/0195915 A1 | 7/2015 | Namkung |
| 2016/0233395 A1 | 8/2016 | Miyamoto |
| 2017/0002149 A1 | 1/2017 | Kim et al. |
| 2018/0113350 A1 * | 4/2018 | Jee ........................... C08J 7/046 |
| 2018/0134848 A1 * | 5/2018 | Ju ....................... C08G 73/1042 |
| 2019/0225806 A1 | 7/2019 | Muramatsu et al. |
| 2021/0147635 A1 | 5/2021 | Jang et al. |

FOREIGN PATENT DOCUMENTS

| CN | 101107324 A | 1/2008 | |
|---|---|---|---|
| CN | 102300932 A | 12/2011 | |
| CN | 104262970 A | 1/2015 | |
| CN | 104371334 A | 2/2015 | |
| CN | 104945914 A | 9/2015 | |
| JP | 2018048214 A | 3/2018 | |
| TW | 200628953 A | 8/2006 | |
| WO | 2007055395 A1 | 5/2007 | |
| WO | 2010087525 A1 | 8/2010 | |
| WO | 2017087351 A1 | 5/2017 | |
| WO | WO-2017123899 A1 * | 7/2017 | ............. B32B 17/00 |
| WO | 2019217671 A1 | 11/2019 | |

OTHER PUBLICATIONS

English translation for TW200628953A, obtained from https://worldwide.espacenet.com/ on Oct. 16, 2022, 16 pages.
International Search Report for PCT/US2019/031511 dated Sep. 10, 2019, 3 pages.
Machine assisted English translation of CN104371334A obtained from https://patents.google.com on Dec. 16, 2021, 10 pages.
Machine assisted English translation of CN104945194A obtained from https://patents.google.com on Dec. 16, 2021, 10 pages.

* cited by examiner

*Primary Examiner* — Marc S Zimmer
(74) *Attorney, Agent, or Firm* — WARNER NORCROSS + JUDD LLP

(57) ABSTRACT

A silicone back plate for a flexible display is disclosed herein. The silicone back plate is formed by a cured silicone product having from 70 to 95 of a Shore A hardness measured in accordance with ASTM D2240, and having at least 10 MPa of a tensile strength and at least 30% of an elongation measured in accordance with ASTM D412. The silicone back plate can provide the flexible display with reliability.

10 Claims, 1 Drawing Sheet

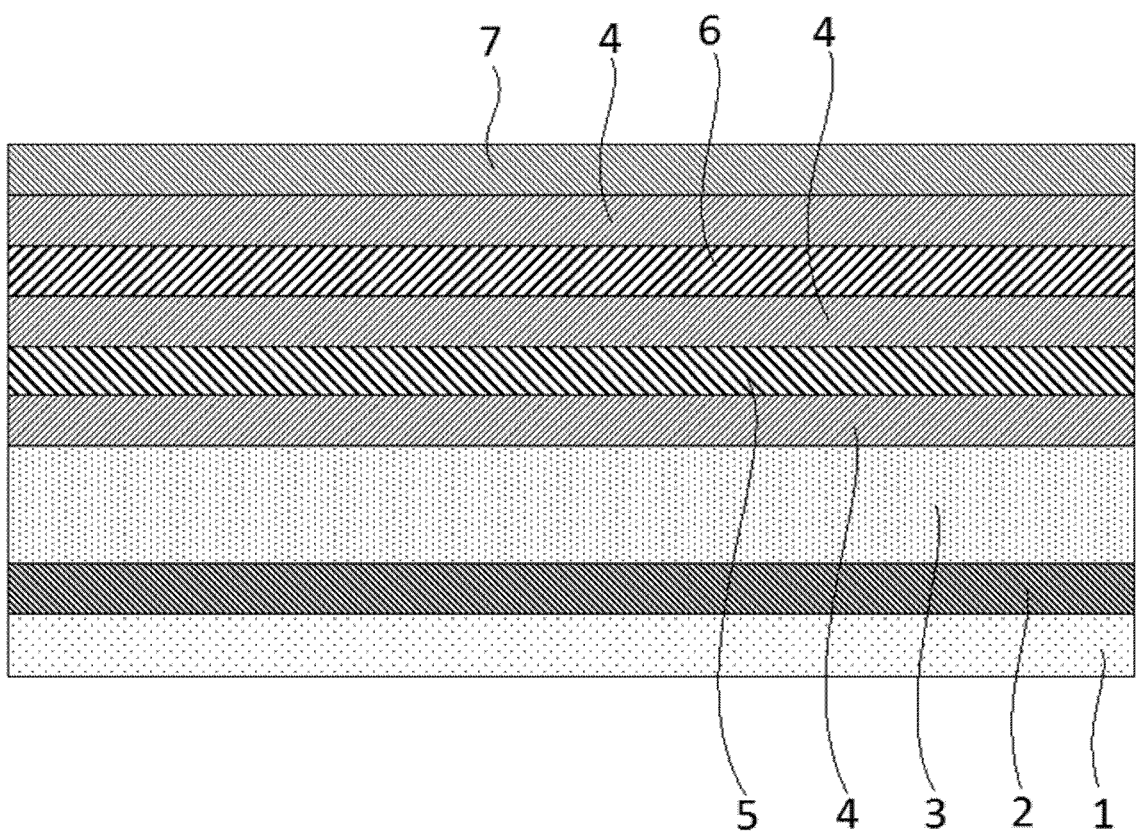

SILICONE BACK PLATE FOR FLEXIBLE DISPLAY

CROSS-REFERENCE TO RELATED APPLICATIONS

This application is the U.S. National Stage of International Appl. No. PCT/US2019/031511 filed on 9 May 2019, which claims priority to and all advantages of U.S. Provisional Application No. 62/670,184, filed on 11 May 2018, the content of which is incorporated herein by reference.

TECHNICAL FIELD

The present invention generally relates to a silicone article and, more specifically, to a silicone back plate for a flexible display, such as an organic light-emitting diode (OLED) display.

BACKGROUND ART

A flexible display, which comprises a flexible substrate and a display device formed on the substrate, shows visual information even when the display is folded or bent. The display device is exemplified by a cholesteric liquid crystal display (LCD) device, a polymer dispersed liquid crystal (PDLC) device, an electrophoretic display (EPD) device, and an organic light-emitting diode (OLED) device. The flexible substrate is exemplified by a plastic substrate made of an organic material, a substrate having a structure where the organic material and an inorganic material are laminated, and a substrate including metal such as thin stainless steel or aluminum.

In the flexible display, gas permeability of oxygen or moisture to the flexible substrate is important according to the display device. Particularly, since the OLEDs are very vulnerable to oxygen or moisture, there are problems in that performance and a life of OLEDs are reduced due to permeation of oxygen or moisture. To avoid the above problems, the plastic substrate such as polyethylene terephthalate (PET), polyester, polyethylene naphthalate (PEN), polyetheretherketone (PEEK), polycarbonate (PC), polyethersulfone (PES), polyimide (PI), polyarylate (PAR), polycyclic olefin (PCO), and polynorbornene are used. For example, flexible displays are disclosed in U.S. Patent Application Publication Nos. 2015/0021570 A1 and 2015/0195915 A1.

Meanwhile, cured silicone materials have been used in a wide range of industrial fields since cured silicone materials exhibit excellent heat resistance, cold resistance, electrical insulating properties, weather resistance, water repellency, and transparency. In particular, cured silicone materials are less likely to be discolored compared to other organic materials and cause less degradation of physical properties. Therefore, cured silicone materials are suitable as optical materials.

With the recent increasing brightness of the flexible display, additional problems have been identified, such as a decrease in durability of the flexible display using the organic materials. However, conventional cured silicone materials do not exhibit sufficient toughness and are seldom used as the flexible substrate for the flexible display.

PRIOR ART DOCUMENTS

Patent Documents

Patent Document 1: U.S. Patent Application Publication No. 2015/0021570 A1

Patent Document 2: U.S. Patent Application Publication No. 2015/0195915 A1

BRIEF SUMMARY OF INVENTION

Technical Problem

An object of the present invention is to provide a silicone back plate which can provide a flexible display with reliability.

Solution to Problem

The silicone back plate for a flexible display of the present invention is characterized by being formed by a cured silicone product having a Shore A hardness of from 70 to 95 as measured in accordance with ASTM D2240, a tensile strength of at least 10 MPa and an elongation of at least 30% as measured in accordance with ASTM D412.

The cured silicone product is typically obtained by curing a hydrosilylation curable silicone composition. In certain embodiments, the hydrosilylation curable silicone composition comprises:

(A) an alkenyl group-containing organopolysiloxane comprising the following components ($A_1$) and ($A_2$):
  ($A_1$) a linear organopolysiloxane having at least two alkenyl groups per molecule, and
  ($A_2$) a resinous organopolysiloxane comprising $SiO_{4/2}$ units, $R^1_2R^2SiO_{1/2}$ units, and $R^1_3SiO_{1/2}$ units, wherein each $R^1$ is the same or different monovalent hydrocarbon group free of aliphatic unsaturated bonds, and each $R^2$ is independently an alkenyl group, providing that a content of the alkenyl groups is 0.5 to 5.0 mass %, and wherein a ratio of the total number of moles of the $R^1_2R^2SiO_{1/2}$ units and $R^1_3SiO_{1/2}$ units to 1 mole of the $SiO_{4/2}$ units is in a range from 0.70 to 1.10,
wherein a content of component ($A_2$) is in an amount of from 45 to 65 mass % of total mass of components ($A_1$) and ($A_2$);
(B) an organopolysiloxane having at least two silicon atom-bonded hydrogen atom per molecule, in an amount such that the silicon atom-bonded hydrogen atoms in component (B) is from 0.1 to 5 moles per 1 mole of the alkenyl groups in component (A); and
(C) a hydrosilylation reaction catalyst, in a catalytic quantity.

Component (B) is typically an organopolysiloxane comprising the following components ($B_1$) and ($B_2$):
($B_1$) a resinous organopolysiloxane comprising $SiO_{4/2}$ units and $R^1_2HSiO_{1/2}$ units, wherein $R^1$ are as described above, and wherein a ratio of the total number of moles of the $R^1_2HSiO_{1/2}$ units to 1 mole of the $SiO_{4/2}$ units is in a range of from 0.70 to 1.80,
($B_2$) a linear or partially branched organopolysiloxane having at least two silicon atom-bonded hydrogen atoms per molecule,
wherein a content of component ($B_1$) is in an amount of from 50 to 90 mass % of total mass of components ($B_1$) and ($B_2$).

In specific embodiments, component ($B_2$) is an organopolysiloxane comprising the following components ($B_{2-1}$) to ($B_{2-2}$):
($B_{2-1}$) a linear or partially branched organopolysiloxane having at least two silicon atom-bonded hydrogen atoms per molecule, and having not less than 0.5 mass % of silicon atom-bonded hydrogen atoms, and ($B_{2-2}$) a linear organopolysiloxane having at least two silicon atom-bonded hydrogen atoms per molecule, and having less than 0.5 mass % of silicon atom-bonded hydrogen atoms, wherein a content of component ($B_{2-1}$) is in an amount of from 1 to 30 mass % of total mass of components ($B_1$) and ($B_2$), and a content of component ($B_{2-2}$) is in an amount of from 1 to 30 mass % of total mass of components ($B_1$) and ($B_2$).

In certain embodiments, component ($B_{2-1}$) is an organopolysiloxane selected from the group consisting of a linear methylhydrogenpolysiloxane endblocked at both molecular chain terminals with trimethylsiloxy groups, a partially branched methylhydrogenpolysiloxane endblocked at molecular chain terminals with trimethylsiloxy groups, and a mixture thereof.

In certain embodiments, component ($B_{2-2}$) is an organopolysiloxane selected from the group consisting of a copolymer of dimethylsiloxane and methylhydrogensiloxane endblocked at both molecular chain terminals with dimethylhydrogensiloxy groups, a dimethylpolysiloxane endblocked at both molecular chain terminals with dimethylhydrogensiloxy groups, and a mixture thereof.

The hydrosilylation curable silicone composition may further comprise: (D) a hydrosilylation reaction inhibitor, in an amount of from 0.001 to 5 parts by mass per 100 parts by mass of component (A).

The flexible display of the present invention comprises: a display device, and the silicone back plate as mentioned above as a flexible substrate for the display device. The display device is generally selected from a group consisting of a cholesteric liquid crystal display (LCD) device, a polymer dispersed liquid crystal (PDLC) device, an electrophoretic display (EPD) device, and an organic light-emitting diode (OLED) device.

Effects of Invention

The silicone back plate of the present invention can provide a flexible display device with reliability.

BRIEF DESCRIPTION OF THE DRAWING(S)

FIG. 1 is a cross-sectional view of an organic light-emitting device (OLED) display that comprises an example of the silicone back plate of the present invention.

DEFINITIONS

The terms "comprising" or "comprise" are used herein in their broadest sense to mean and encompass the notions of "including," "include," "consist(ing) essentially of," and "consist(ing) of. The use of "for example," "e.g.," "such as," and "including" to list illustrative examples does not limit to only the listed examples. Thus, "for example" or "such as" means "for example, but not limited to" or "such as, but not limited to" and encompasses other similar or equivalent examples. The term "about" as used herein serves to reasonably encompass or describe minor variations in numerical values measured by instrumental analysis or as a result of sample handling. Such minor variations may be in the order of ±0-25, ±0-10, ±0-5, or ±0-2.5, % of the numerical values. Further, The term "about" applies to both numerical values when associated with a range of values. Moreover, the term "about" may apply to numerical values even when not explicitly stated.

Generally, as used herein a hyphen "-" or dash "-" in a range of values is "to" or "through"; a ">" is "above" or "greater-than"; a "≥" is "at least" or "greater-than or equal to"; a "<" is "below" or "less-than"; and a "≤" is "at most" or "less-than or equal to." On an individual basis, each of the aforementioned applications for patent, patents, and/or patent application publications, is expressly incorporated herein by reference in its entirety in one or more non-limiting embodiments.

It is to be understood that the appended claims are not limited to express and particular compounds, compositions, or methods described in the detailed description, which may vary between particular embodiments which fall within the scope of the appended claims. With respect to any Markush groups relied upon herein for describing particular features or aspects of various embodiments, it is to be appreciated that different, special, and/or unexpected results may be obtained from each member of the respective Markush group independent from all other Markush members. Each member of a Markush group may be relied upon individually and or in combination and provides adequate support for specific embodiments within the scope of the appended claims.

It is also to be understood that any ranges and subranges relied upon in describing various embodiments of the present invention independently and collectively fall within the scope of the appended claims, and are understood to describe and contemplate all ranges including whole and/or fractional values therein, even if such values are not expressly written herein. One of skill in the art readily recognizes that the enumerated ranges and subranges sufficiently describe and enable various embodiments of the present invention, and such ranges and subranges may be further delineated into relevant halves, thirds, quarters, fifths, and so on. As just one example, a range "of from 0.1 to 0.9" may be further delineated into a lower third, i.e., from 0.1 to 0.3, a middle third, i.e., from 0.4 to 0.6, and an upper third, i.e., from 0.7 to 0.9, which individually and collectively are within the scope of the appended claims, and may be relied upon individually and/or collectively and provide adequate support for specific embodiments within the scope of the appended claims. In addition, with respect to the language which defines or modifies a range, such as "at least," "greater than," "less than," "no more than," and the like, it is to be understood that such language includes subranges and/or an upper or lower limit. As another example, a range of "at least 10" inherently includes a subrange of from at least 10 to 35, a subrange of from at least 10 to 25, a subrange of from 25 to 35, and so on, and each subrange may be relied upon individually and/or collectively and provides adequate support for specific embodiments within the scope of the appended claims. Finally, an individual number within a disclosed range may be relied upon and provides adequate support for specific embodiments within the scope of the appended claims. For example, a range "of from 1 to 9" includes various individual integers, such as 3, as well as individual numbers including a decimal point (or fraction), such as 4.1, which may be relied upon and provide adequate support for specific embodiments within the scope of the appended claims.

DETAILED DESCRIPTION OF THE INVENTION

First, the silicone back plate for a flexible display of the present invention will be explained in detail.

As shown in FIG. 1, an example of a flexible display comprises a silicone back plate 1, an adhesive 2, a display device 3, an optical clear adhesive 4, a polarize film layer 5, a touch sensor 6, and a cover window 7. In the flexible display, the silicone back plate 1 of the present invention comprises a cured silicone product having a Shore A hardness of from 70 to 95 of as measured in accordance with ASTM D2240, a tensile strength of at least 10 MPa and an elongation of at least 30% as measured in accordance with ASTM D412.

The silicone back palate 1 is formed by a cured silicone product having a hardness, as measured using Shore A hardness specified in ASTM D2240, in the range of from 70 to 95, alternatively in the range of from 75 to 95, alternatively in the range of from 75 to 90. The reasons for this are as follows: the silicone back plate may have insufficient strength when its hardness is less than the lower limit for the cited range; when, on the other hand, the upper limit for the cited range is exceeded, the flexibility of the silicone back plate under consideration tends to be inadequate.

In order to exhibit a satisfactory flexibility, the silicone back plate 1 is formed by a cured silicone product having a tensile strength of at least 10 MPa and an elongation of at least 30% as specified and measured in accordance with ASTM D412. The tensile strength is typically at least 15 MPa. In these or other embodiments, the elongation is typically at least 50%. The reason for this is that the flexibility of the silicone back plate becomes unsatisfactory at below the indicated range.

The silicone back plate 1 has a thickness of 300 μm or less of cured silicone product so as to assure desirable flexibility of the flexible display. In consideration of economic efficiency, the cured silicone product may be obtained by curing a hydrosilylation curable silicone composition, especially the hydrosilylation curable silicone composition comprising:

(A) an alkenyl group-containing organopolysiloxane comprising, alternatively consisting essentially of, alternatively consisting of, the following components $(A_1)$ and $(A_2)$:
  $(A_1)$ a linear organopolysiloxane having at least two alkenyl groups per molecule, and
  $(A_2)$ a resinous organopolysiloxane comprising, alternatively consisting essentially of, alternatively consisting of, $SiO_{4/2}$ units, $R^1_2R^2SiO_{1/2}$ units, and $R^1_3SiO_{1/2}$ units, wherein $R^1$ are the same or different monovalent hydrocarbon groups free of aliphatic unsaturated bonds, and $R^2$ is an alkenyl group, providing that a content of the alkenyl groups is 0.5 to 5.0 mass %, and wherein a ratio of the total number of moles of the $R^1_2R^2SiO_{1/2}$ units and $R^1_3SiO_{1/2}$ units to 1 mole of the $SiO_{4/2}$ units is in a range from 0.70 to 1.10,
  wherein a content of component $(A_2)$ is in an amount of from 45 to 65 mass % of total mass of components $(A_1)$ and $(A_2)$;
(B) an organopolysiloxane having at least two silicon atom-bonded hydrogen atom per molecule, in an amount such that the silicon atom-bonded hydrogen atoms in this component is 0.1 to 5 moles per 1 mole of the alkenyl groups in component (A); and
(C) a hydrosilylation reaction catalyst, in a catalytic quantity.

Component (A) is an alkenyl-containing organopolysiloxane, and is used as a base component of the composition. Component (A) consists essentially of the following components $(A_1)$ and $(A_2)$.

Component $(A_1)$ is a linear organopolysiloxane having at least two alkenyl groups pre molecule. The alkenyl groups in component $(A_1)$ are exemplified by alkenyl groups having from 2 to 12 carbon atoms such as vinyl groups, allyl groups, butenyl groups, pentenyl groups, hexenyl groups, heptenyl groups, octenyl groups, nonenyl groups, decenyl groups, undecenyl groups, and dodecenyl groups. Vinyl groups and allyl groups are typical. Silicon atom-bonded groups other than the alkenyl groups in component $(A_1)$ are exemplified by alkyl groups having from 1 to 12 carbon atoms, such as methyl groups, ethyl groups, propyl groups, butyl groups, pentyl groups, hexyl groups, heptyl groups, octyl groups, nonyl groups, decyl groups, undecyl groups, and dodecyl groups; aryl groups having from 6 to 12 carbon atoms, such as phenyl groups, tolyl groups, xylyl groups, and naphthyl groups; aralkyl groups having from 7 to 12 carbon atoms, such as benzyl groups, phenethyl groups, and naphthylethyl groups; and halogen-substituted alkyl groups having from 1 to 12 carbon atoms, such as 3-chloropropyl groups, and 3,3,3-trifluoropropyl groups. Methyl groups and phenyl groups are typical.

Component $(A_1)$ has a substantially straight chain molecular structure, but a portion of the molecular chain may be branched or somewhat branched. The viscosity of component $(A_1)$ at 25° C. is not limited, but is typically in the range of from 1,000 mPa·s to 50,000 mPa·s, alternatively in the range of from 1,500 mPa·s to 45,000 mPa·s, alternatively in the range of from 2,000 mPa·s to 45,000 mPa·s. The reasons for the preceding are as follows: when the viscosity of component $(A_1)$ at 25° C. is less than the lower limit cited above, the cured product provided by curing the composition tends to have an unsatisfactory flexibility; when, on the other hand, the viscosity of component $(A_1)$ at 25° C. exceeds the upper limit cited above, the transparency of the cured silicone product provided by curing the composition tends to decline at high temperatures, while the composition assumes an excessively high viscosity and the handling characteristics tend to decline.

The organopolysiloxanes for component $(A_1)$ are exemplified by dimethylpolysiloxanes endblocked at both molecular chain terminals with dimethylvinylsiloxy groups, copolymers of dimethylsiloxane and methylvinylsiloxane endblocked at both molecular chain terminals with dimethylvinylsiloxy groups, methylvinylpolysiloxanes endblocked at both molecular chain terminals with trimethylsiloxy groups, copolymers of dimethylsiloxane and methylvinylsiloxane endblocked at both molecular chain terminals with trimethylsiloxy groups, and mixtures of two or more of the preceding.

Component $(A_2)$ is a resinous organopolysiloxane comprising, alternatively consisting essentially of, alternatively consisting of, $SiO_{4/2}$ units, $R^1_2R^2SiO_{1/2}$ units, and $R^1_3SiO_{1/2}$ units, and is used to impart a satisfactory hardness and flexibility to the cured product provided by curing the composition.

In the formula, $R^1$ are the same or different monovalent hydrocarbon groups free of aliphatic unsaturated bonds. The hydrocarbon groups for $R^1$ are exemplified by alkyl groups having from 1 to 12 carbon atoms, such as methyl groups, ethyl groups, propyl groups, butyl groups, pentyl groups, hexyl groups, heptyl groups, octyl groups, nonyl groups, decyl groups, undecyl groups, and dodecyl groups; aryl groups having from 6 to 12 carbon atoms, such as phenyl groups, tolyl groups, xylyl groups, and naphthyl groups; aralkyl groups having from 7 to 12 carbon atoms, such as benzyl groups, phenethyl groups, and naphthylethyl groups; and halogen-substituted alkyl groups having from 1 to 12 carbon atoms, such as 3-chloropropyl groups, and 3,3,3-trifluoropropyl groups. Methyl groups and phenyl groups are typical.

In the formula, each $R^2$ independently is an alkenyl group. The alkenyl groups for $R^2$ are exemplified by alkenyl groups having from 2 to 12 carbon atoms such as vinyl groups, allyl groups, butenyl groups, pentenyl groups, hexenyl groups, heptenyl groups, octenyl groups, nonenyl groups, decenyl groups, undecenyl groups, and dodecenyl groups. Vinyl groups and allyl groups are typical.

Component ($A_2$) has a alkenyl group content of 0.5 to 5.0 mass %, alternatively 1.0 to 5.0 mass %, alternatively 2.0 to 5.0 mass %, alternatively 3.0 to 5.0 mass %, alternatively 3.0 to 4.5 mass %. The reasons for this are as follows: when the alkenyl group content is less than the cited lower limit, the hardness of the cured silicone product provided by curing the composition tends to decline; when, on the other hand, the alkenyl group content exceeds the cited upper limit, the flexibility of the cured silicone product provided by curing the composition tends to decline.

The ratio of the total number of moles of $R^1{}_2R^2SiO_{1/2}$ and $R^1{}_3SiO_{1/2}$ units to 1 mole of the $SiO_{4/2}$ unit in component ($A_2$) is in the range of from 0.70 to 1.10, alternatively in the range of from 0.80 to 1.10. The reasons for this are as follows: when the ratio is less than the cited lower limit, component ($A_2$) takes on an excessively large molecular weight and the transparency of the cured silicone product provided by curing the composition may decline; when, on the other hand, the ratio exceeds the upper limit cited above, the cured silicone product provided by curing the composition may have an unsatisfactory strength.

The content of component ($A_2$) is in a range of from 45 to 65 mass % of total mass of components ($A_1$) and ($A_2$), alternatively in a range of from 45 to 60 mass %, alternatively in a range of from 45 to 55 mass %. The reasons for this are as follows: when the content is less than the lower limit on the cited range, the hardness of the cured silicone product provided by curing the composition tends to decline; when, on the other hand, the content exceeds the upper limit on the cited range, the flexibility of the cured silicone product provided by curing the composition tends to decline.

Component (B) is a silicon atom-bonded hydrogen atom-containing organopolysiloxane, and is used as a crosslinking agent for the present composition. The silicon atom-bonded hydrogen atoms may be bonded in, for example, terminal position on the molecular chain and/or side chain position on the molecular chain. Silicon atom-bonded groups other than hydrogen atoms in component (B) are exemplified by monovalent hydrocarbon groups free of aliphatic unsaturated bonds as described $R^1$. Methyl groups and phenyl groups are typical.

In certain embodiments, component (B) is an organopolysiloxane comprising, alternatively consisting essentially of, alternatively consisting of, the following components ($B_1$) and ($B_2$):
($B_1$) a resinous organopolysiloxane comprising, alternatively consisting essentially of, alternatively consisting of, $SiO_{4/2}$ units and $R^1{}_2HSiO_{1/2}$ units, wherein $R^1$ are as described above, and wherein a ratio of the total number of moles of the $R^1{}_2HSiO_{1/2}$ units to 1 mole of the $SiO_{4/2}$ units is in a range from 0.70 to 1.80,
($B_2$) a linear or partially branched organopolysiloxane having at least two silicon atom-bonded hydrogen atoms per molecule,
wherein a content of component ($B_1$) is in an amount of from 50 to 90 mass % of total mass of components ($B_1$) and ($B_2$).

Component ($B_1$) is a resinous organopolysiloxane comprising, alternatively consisting essentially of, alternatively consisting of, $SiO_{4/2}$ units and $R^1{}_2HSiO_{1/2}$ units.

In the formula, $R^1$ are the same or different monovalent hydrocarbon groups free of aliphatic unsaturated bonds as described above. Methyl groups and phenyl groups are typical.

In the formula, a ratio of the total number of moles of the $R^1{}_2HSiO_{1/2}$ units to 1 mole of the $SiO_{4/2}$ units is in a range of from 0.70 to 1.80, alternatively in a range of from 0.80 to 1.70, alternatively in a range of from 0.90 to 1.70, alternatively in a range of from 1.00 to 1.70. The reasons for this are as follows: when the ratio is less than the cited lower limit, component ($B_1$) takes on an excessively large molecular weight and the transparency of the cured silicone product provided by curing the composition may decline; when, on the other hand, the ratio exceeds the upper limit cited above, the cured silicone product provided by curing the composition may have an unsatisfactory strength.

The content of component ($B_1$) is in an amount of from 50 to 90 mass % of total mass of components ($B_1$) and ($B_2$), alternatively in an amount of from 60 to 90 mass %, alternatively in an amount of from 70 to 90 mass %. The reasons for this are as follows: when the content is less than the cited lower limit, the cured silicone product provided by curing the composition may have an unsatisfactory strength; when, on the other hand, the content exceeds the upper limit cited above, the cured product provided by curing the composition may have an unsatisfactory elongation.

Component ($B_2$) is a linear or partially branched organopolysiloxane having at least two silicon atom-bonded hydrogen atoms per molecule. Component ($B_2$) is typically an organopolysiloxane comprising, alternatively consisting essentially of, alternatively consisting of, the following components ($B_{2-1}$) to ($B_{2-2}$):
($B_{2-1}$) a linear or partially branched organopolysiloxane having at least two silicon atom-bonded hydrogen atoms per molecule, and having not less than 0.5 mass % of silicon atom-bonded hydrogen atoms, and
($B_{2-2}$) a linear organopolysiloxane having at least two silicon atom-bonded hydrogen atoms per molecule, and having less than 0.5 mass % of silicon atom-bonded hydrogen atoms.

Component ($B_{2-1}$) is a linear or partially branched organopolysiloxane having at least two silicon atom-bonded hydrogen atoms per molecule, and has not less than 0.5 mass % of silicon atom-bonded hydrogen atoms. There are no limitations on the bonding position of the silicon atom-bonded hydrogen atoms in component ($B_{2-1}$), and the silicon atom-bonded hydrogen atoms may be bonded in, for example, terminal position on the molecular chain and/or side chain position on the molecular chain. Silicon atom-bonded groups other than hydrogen atoms in component ($B_{2-1}$) are exemplified by monovalent hydrocarbon groups free of aliphatic unsaturated bonds as described $R^1$. Methyl groups and phenyl groups are typical. While there is no limitation on the viscosity of component ($B_{2-1}$), but its viscosity at 25° C. is generally in the range of from 1 to 1,000 mm$^2$/s, alternatively is in the range of from 1 to 100 mm$^2$/s.

The organopolysiloxane for component ($B_{2-1}$) are exemplified by linear copolymers of dimethylsiloxane and methylhydrogensiloxane endblocked at both molecular chain terminals with dimethylhydrogensiloxy groups, partially branched copolymers of dimethylsiloxane and methylhydrogensiloxane endblocked at molecular chain terminals with dimethylhydrogensiloxy groups, linear methylhydrogenpolysiloxanes endblocked at both molecular chain terminals with trimethylsiloxy groups, partially branched methylhydrogenpolysiloxanes endblocked at molecular chain terminals with trimethylsiloxy groups, linear copolymers of dimethylsiloxane and methylhydrogensiloxane endblocked at both molecular chain terminals with trimethylsiloxy groups, partially branched copolymers of dimethylsiloxane and methylhydrogensiloxane endblocked at molecular chain terminals with trimethylsiloxy groups, and mixtures of two or more of the preceding.

The content of component $(B_{2\text{-}1})$ is in an amount of from 1 to 30 mass % of total mass of components $(B_1)$ to $(B_2)$, alternatively in an amount of from 1 to 25 mass %. The reasons for this are as follows: when the content is less than the cited lower limit, the cured silicone product provided by curing the composition may have an unsatisfactory elongation; when, on the other hand, the content exceeds the upper limit cited above, the cured silicone product provided by curing the composition may have an unsatisfactory strength.

Component $(B_{2\text{-}2})$ is a linear organopolysiloxane having at least two silicon atom-bonded hydrogen atoms per molecule, and has less than 0.5 mass % of silicon atom-bonded hydrogen atoms. There are no limitations on the bonding position of the silicon atom-bonded hydrogen atoms in component $(B_{2\text{-}2})$, and the silicon atom-bonded hydrogen atoms may be bonded in, for example, terminal position on the molecular chain and/or side chain position on the molecular chain. Silicon atom-bonded groups other than hydrogen atoms in component $(B_{2\text{-}2})$ are exemplified by monovalent hydrocarbon groups free of aliphatic unsaturated bonds as described $R^1$. Methyl groups and phenyl groups are typical. While there is no limitation on the viscosity of component $(B_{2\text{-}2})$, its viscosity at 25° C. is generally in the range of from 1 to 1,000 mm$^2$/s, alternatively in the range of from 1 to 100 mm$^2$/s.

The organopolysiloxane for component $(B_{2\text{-}2})$ are exemplified by copolymers of dimethylsiloxane and methylhydrogensiloxane endblocked at both molecular chain terminals with dimethylhydrogensiloxy groups, dimethylpolysiloxanes endblocked at both molecular chain terminals with dimethylhydrogensiloxy groups, and mixtures of two or more of the preceding.

The content of component $(B_{2\text{-}2})$ is in an amount of from 1 to 30 mass % of total mass of components $(B_1)$ to $(B_2)$, alternatively in an amount of from 1 to 25 mass %. The reasons for this are as follows: when the content is less than the cited lower limit, the cured silicone product provided by curing the composition may have an unsatisfactory strength; when, on the other hand, the content exceeds the upper limit cited above, the cured silicone product provided by curing the composition may have an unsatisfactory elongation.

The content of component (B) in the present composition is an amount that provides from 0.1 to 5 moles, alternatively from 0.5 to 3 moles, alternatively from 0.5 to 2 moles of the silicon atom-bonded hydrogen atoms in this component per 1 mole of the alkenyl groups in component (A). The reasons for this are as follows: when the content is less than the lower limit for the cited range, curing of the composition tends to be unsatisfactory; when, on the other hand, the upper limit for the cited range is exceeded, the flexibility and/or transparency of the cured silicone product provided by curing the composition may be diminished.

Component (C) is a hydrosilylation reaction catalyst, and promotes curing of the composition. The hydrosilylation reaction catalysts for component (C) are exemplified by platinum-type catalysts, rhodium-type catalysts, and palladium-type catalysts. The platinum-type catalysts are particularly typical. These platinum-type catalysts are exemplified by platinum micropowder, platinum black, platinum supported on silica micropowder, platinum supported on active carbon, chloroplatinic acid, alcohol solutions of chloroplatinic acid, and platinum compounds such as olefin complexes of platinum, alkenylsiloxane complexes of platinum, and the like.

The content of component (C) in the composition is a catalytic quantity and in specific terms is a quantity that provides 0.01 to 1,000 mass-ppm catalyst metal atoms with reference to the present composition. The reasons for this are as follows: when the content is less than the lower limit for the cited range, the risk arises that the cure of the resulting composition will not proceed adequately; on the other hand, curing is not significantly promoted by exceeding the upper limit for the cited range, while the risk arises that problems will appear such as discoloration of the cured silicone product.

The composition may further comprise (D) a hydrosilylation reaction inhibitor in order to adjust the cure rate of the present composition. The hydrosilylation reaction inhibitors for component (D) are exemplified by alkyne alcohols such as 2-methyl-3-butyn-2-ol, 3,5-dimethyl-1-hexyn-3-ol, 1-ethynylcyclohexan-1-ol, and 2-phenyl-3-butyn-2-ol; eneyne compounds such as 3-methyl-3-penten-1-yne, and 3,5-dimethyl-3-hexen-1-yne; as well as 1,3,5,7-tetramethyl-1,3,5,7-tetravinylcyclotetrasiloxane, and 1,3,5,7-tetramethyl-1,3,5,7-tetrahexenylcyclotetrasiloxane, benzotriazole, and the like.

There is no limitation on the content of component (D) in the composition, and this content may be selected as appropriate as a function of the molding method and curing conditions; however, an amount within the range from 0.001 to 5 parts by mass per 100 parts by mass of component (A) is generally utilized.

The composition may incorporate, insofar as the object of the present invention is not impaired, for example, an adhesion promoter, flame retardant, inorganic filler, and so forth. However, as a general matter, an adhesion promoter, flame retardant, and inorganic filler are typically not incorporated from the perspective of the transparency of the cured silicone product provided by curing the composition.

In FIG. 1, an adhesive 2 is used to adhere the silicone back plate 1 and a flexible display 3. However, the adhesive 2 may be optional when the silicone back plate 1 adhere to the flexible display 3 directly. The adhesive 2 may be a silicone adhesive or an acrylic adhesive. The adhesive 2 in not limited as long as flexibility of the flexible display is not significantly reduced. Typically, the thickness of the adhesive 2 is 10 μm and less.

Examples of the display device 3 include a cholesteric liquid crystal display (LCD) device, a polymer dispersed liquid crystal (PDLC) device, an electrophoretic display (EPD) device, and an organic light-emitting diode (OLED) device.

The cholesteric LCD has a planar alignment spiral structure, and a characteristic in which light is selectively reflected according to a twisting direction and a pitch of a repeating structure.

The PDLC is one of liquid crystal cells that are applied to the liquid crystal display (LCD), and is characterized in that transmittance of light is controlled according to the scattering of light and it is unnecessary to use a polarizing plate.

Examples of the electrophoretic type of device may include a device using capsulated particles, a device using charged particles, a device using spinning of particles, and a device using movement of particles in a lateral direction.

The OLED has a structure in which electrodes and organic layers are evenly deposited. The OLED has a multilayered structure in which four organic layers including a hole injection layer, a hole transport layer, a light-emitting layer, and an electron transport layer, and electrodes are evenly deposited. This is not shown in FIG. 1. If voltage is applied between two electrodes, the hole is injected from the anode to the organic layers, and the electron is injected from the cathode to the organic layers. After the injected hole and electron are combined with each other in the light-emitting layer to form an exciton, light is emitted in the course of deactivating the exciton, and red, green, and blue colors are displayed according to the type of light-emitting layer.

An optical clear adhesive 4 is used to adhere the display device 3 to the polarizer film 5, the touch sensor 6 to the polarizer film 5, and the polarizer film 5 to the cover window 7. The optical clear adhesive 4 may be a silicone optical clear adhesive or an acrylic optical clear adhesive. The optical clear adhesive 4 in not limited as long as flexibility of the flexible display is not significantly reduced. Typically, the thickness of the adhesive 4 is 100 μm and less.

As shown in FIG. 1, the polarizer film 5 and the touch sensor 6 are optional layers, but they may be provided on the display device 3 to control the display device 3. In certain embodiments, the touch sensor 6 have a short circuit of the electrode line (not shown) of the display device. Each of the thickness of the polarizer film 5 and the touch sensor 6 is not limited as long as flexibility of the flexible display apparatus is not significantly reduced. Typically, each of the thickness is 10 μm and less.

The flexible display may be covered with a cover window 7 made of flexible material such as a plastic material. The cover window 7 may be made of one or more which is selected from the group consisting of polyethylene terephthalate (PET), polyester, polyethylene naphthalate (PEN), polyetheretherketone (PEEK), polycarbonate (PC), polyethersulfone (PES), polyimide (PI), polyarylate (PAR), polycyclic olefin (PCO), and polynorbornene.

Examples

The silicone back plate for a flexible display of the present invention will now be described in detail hereinafter using Practical and Comparative Examples. In the Examples, the viscosity is the value at 25° C. In the chemical formulae, Me represents a methyl group, and Vi represents a vinyl group.

The following components were used as component (A).
Component (a-1): a dimethylpolysiloxane endblocked at both molecular chain terminals with dimethylvinylsiloxy groups, that has a viscosity of 40,000 mPa·s and a vinyl group content of 0.09 mass %.
Component (a-2): a dimethylpolysiloxane endblocked at both molecular chain terminals with dimethylvinylsiloxy groups, that has a viscosity of 10,000 mPa·s and a vinyl group content of 0.14 mass %.
Component (a-3): an organopolysiloxane having a vinyl group content of 4.20 mass % and represented by the average unit formula:

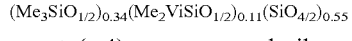

Component (a-4): an organopolysiloxane having a vinyl group content of 3.76 mass % and represented by the average unit formula:

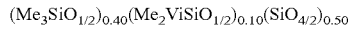

The following components were used as component (B).

Component (b-1): an organopolysiloxane having a silicon atom-bonded hydrogen atom content of 0.96 mass % and represented by the average unit formula:

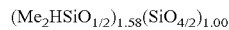

Component (b-2): a partially branched methylhydrogenpolysiloxane endblocked at molecular chain terminals with trimethylsiloxy groups, and having a viscosity at 25° C. of 20 mm²/s and silicon atom-bonded hydrogen atom content of 1.56 mass %.
Component (b-3): a copolymer of dimethylsiloxane and methylhydrogensiloxane endblocked at both molecular chain terminals with dimethylhydrogensiloxy groups, and having a viscosity at 25° C. of 20 mm²/s and silicon atom-bonded hydrogen atom content of 0.15 mass %.

The following component was used as component (C).
Component (c-1): 1,3-divinyltetramethyldisiloxane solution of a 1,3-divinyltetramethyl disiloxane platinum complex (platinum metal content in terms of mass units in this component=approximately 4,000 ppm).

The following components were used as component (D).
Component (d-1): 1-ethynylcyclohexan-1-ol Practical Examples 1 to 3 and Comparative Examples 1 to 4

The components shown in Table 1 were mixed to uniformity in the quantity proportions shown in Table 1 to produce hydrosilylation curable silicone compositions. The resulting compositions were heated for 5 minutes at 150° C. to produce the 1 mm-thick cured silicone product, which was submitted to measurement of the tensile strength and elongation. The compositions were also heated for 10 minutes at 150° C. to produce the 6 mm-thick cured silicone product sheet, which was submitted to measurement of the hardness. The results are given in Table 1. "SiH/Vi" in Table 1 indicates the ratio of the number of moles of silicon atom-bonded hydrogen atoms in component (B) per 1 mole of the vinyl groups in component (A). The properties (hardness, tensile strength, and elongation) of the cured silicone product were tested, measured, or evaluated using the following methods.

<Hardness>
A 6 mm-thick cured product was fabricated by curing the hydrosilylation curable silicone composition by heating for 10 minutes at 150° C. The Shore A hardness of this cured silicone product was measured using the type A durometer specified in ASTM D2240.

<Tensile Strength and Elongation>
A 1 mm-thick cured product was fabricated by curing the hydrosilylation curable silicone composition by heating for 5 minutes at 150° C. The tensile strength and elongation of this cured silicone product were measured according to the methods specified in ASTM D412.

<Tensile of Silicone Back Plate at 300 μm thickness>
A 300 μm-thick cured product of the curable silicone composition was fabricated by heating for 5 minutes at 150° C. Using the standard die, designed by ASTM D412 Type D, A 300 μm-thick cured product was cut as dumbbell (dogbone)-shaped specimens. The tensile (psi) of this cured product was measured according to the methods specified in ASTM D412.

TABLE 1

| Item | | | Prac. Example 1 | Prac. Example 2 | Prac. Example 3 | Comp. Example 1 | Comp. Example 2 | Comp. Example 3 | Comp. Example 4 |
|---|---|---|---|---|---|---|---|---|---|
| Composition of curable silicone composition (parts by mass) | (A$_1$) | (a-1) | 27.46 | 26.03 | 30.67 | 5.20 | 40.10 | 8.81 | 30.81 |
| | | (a-2) | 16.47 | 16.47 | 16.47 | 42.34 | 13.50 | 20.80 | 16.47 |
| | (A$_2$) | (a-3) | — | — | — | 42.34 | — | — | — |
| | | (a-4) | 44.53 | 44.53 | 44.53 | — | 36.50 | 56.25 | 44.53 |
| | (B$_1$) | (b-1) | 9.30 | 10.73 | 6.09 | 9.96 | 7.48 | 11.90 | — |
| | (B$_2$) | (b-2) | 1.00 | 1.00 | 1.00 | — | 1.00 | 1.00 | 6.95 |
| | (B$_3$) | (b-3) | 1.00 | 1.00 | 1.00 | — | 1.00 | 1.00 | 1.00 |
| | (C) | (c-1) | 0.04 | 0.04 | 0.04 | 0.04 | 0.04 | 0.04 | 0.04 |
| | (D) | (d-1) | 0.20 | 0.20 | 0.20 | 0.20 | 0.20 | 0.20 | 0.20 |
| SiH/Vi | | | 1.7 | 1.9 | 1.2 | 1.4 | 1.7 | 1.6 | 1.7 |
| Cured Silicone Product | Tensile strength (MPa) | | 16.71 | 14.51 | 11.40 | 10.98 | 9.88 | 4.31 | 7.56 |
| | Elongation (%) | | 57 | 54 | 67 | 54 | 68 | 16.3 | 59 |
| | Hardness | | 83 | 83 | 78 | 85 | 75 | 94 | 76 |
| Tensile of Silicone Back Plate at 300 μm thickness (psi) | | | 2423 | 2104 | 1654 | 1593 | 1433 | 625 | 1097 |

INDUSTRIAL APPLICABILITY

Since the silicone back plate of the present invention is stable against light and heat, and is flexible and highly transparent, it is advantageous as a flexible substrate for a flexible display in which high durability is demanded, such as a cholesteric liquid crystal display (LCD), a polymer dispersed liquid crystal (PDLC) display, an electrophoretic display (EPD), and an organic light-emitting diode (OLED) display.

DESCRIPTION OF SYMBOLS

1: Silicone Back Plate
2: Adhesive
3: Flexible Device
4: Optical Clear Adhesive
5: Polarizer Film
6: Touch Sensor
7: Cover Window

What is claimed is:

1. A silicone back plate for a flexible display device, wherein the silicone back plate comprises a cured silicone product having a Shore A hardness of from 70 to 95 as measured in accordance with ASTM D2240, a tensile strength of at least 10 MPa and an elongation of at least 30%, as measured in accordance with ASTM D412;
wherein the cured silicone product is obtained by curing a hydrosilylation curable silicone composition, comprising:
   (A) an alkenyl group-containing organopolysiloxane comprising the following components (A$_1$) and (A$_2$):
      (A$_1$) a linear organopolysiloxane having at least two alkenyl groups per molecule, and
      (A$_2$) a resinous organopolysiloxane comprising SiO$_{4/2}$ units, R$^1_2$R$^2$SiO$_{1/2}$ units, and R$^1_3$SiO$_{1/2}$ units, wherein each R$^1$ is an independently selected monovalent hydrocarbon group free of aliphatic unsaturated bonds, and each R$^2$ independently is an alkenyl group, provided that a content of the alkenyl groups in component (A$_2$) is 0.5 to 5.0 mass %, and wherein a ratio of the total number of moles of the R$^1_2$R$^2$SiO$_{1/2}$ units and R$^1_3$SiO$_{1/2}$ units to 1 mole of the SiO$_{4/2}$ units is in a range of from 0.70 to 1.10,
      wherein a content of component (A$_2$) is in an amount of from 45 to 65 mass % of total mass of components (A$_1$) and (A$_2$);
   (B) an organopolysiloxane having at least two silicon atom-bonded hydrogen atoms per molecule, in an amount such that the silicon atom-bonded hydrogen atoms in component (B) are from 0.1 to 5 moles per 1 mole of the alkenyl groups in component (A); wherein component (B) is an organopolysiloxane comprising the following components (B$_1$) and (B$_2$):
      (B$_1$) a resinous organopolysiloxane comprising SiO$_{4/2}$ units and R$^1_2$HSiO$_{1/2}$ units, wherein each R$^1$ is as described above, and wherein a ratio of the total number of moles of the R$^1_2$HSiO$_{1/2}$ units to 1 mole of the SiO$_{4/2}$ units is in a range from 0.70 to 1.80,
      (B$_2$) a linear or partially branched organopolysiloxane having at least two silicon atom-bonded hydrogen atoms per molecule,
      wherein a content of component (B$_1$) is in an amount of from 50 to 90 mass % of total mas of components (B$_1$) and (B$_2$);
      wherein component (B$_2$) is an organopolysiloxane comprising the following components (B$_{2-1}$) and (B$_{2-2}$):
         (B$_{2-1}$) partially branched organopolysiloxane having at least two silicon atom-bonded hydrogen atoms per molecule, and having not less than 0.5 mass % of silicon atom-bonded hydrogen atoms, and
         (B$_{2-2}$) a linear organopolysiloxane having at least two silicon atom-bonded hydrogen atoms per molecule, and having less than 0.5 mass % of silicon atom-bonded hydrogen atoms.

2. The silicone back plate according to claim 1, wherein a content of component (B$_{2-1}$) is in an amount of from 1 to 30 mass % of total mass of components (B$_1$) and (B$_2$), and a content of component (B$_{2-2}$) is in an amount of from 1 to 30 mass % of total mass of components (B$_1$) and (B$_2$).

3. The silicone back plate according to claim 1, wherein component (B$_{2-1}$) is a partially branched methylhydrogenpolysiloxane endblocked at molecular terminals with trimethylsiloxy groups; or
wherein component (B$_{2-2}$) comprises a linear methylhydrogenpolysiloxane endblocked at both molecular terminals with trimethylsiloxy groups.

4. The silicone back plate according to claim 3, wherein component ($B_{2-2}$) is an organopolysiloxane selected from the group consisting of a copolymer of dimethylsiloxane and methylhydrogensiloxane endblocked at both molecular chain terminals with dimethylhydrogensiloxy groups, a dimethylpolysiloxane endblocked at both molecular chain terminals with dimethylhydrogensiloxy groups, and a mixture thereof.

5. The silicone back plate according to claim 1, wherein the hydrosilylation curable silicone composition further comprises:
(D) a hydrosilylation reaction inhibitor, in an amount of from 0.001 to 5 parts by mass per 100 parts by mass of component (A).

6. A flexible display comprising:
a display device, and
the silicone back plate according to claim 1 as a flexible substrate for the display device.

7. The flexible display according to claim 6, wherein the display device is selected from a group consisting of a cholesteric liquid crystal display (LCD) device, a polymer dispersed liquid crystal (PDLC) device, an electrophoretic display (EPD) device, and an organic light-emitting diode (OLED) device.

8. An electronic device comprising the flexible display of claim 7.

9. An electronic device comprising the flexible display of claim 6.

10. The silicone back plate according to claim 1, wherein component ($B_{2-2}$) is an organopolysiloxane selected from the group consisting of a copolymer of dimethylsiloxane and methylhydrogensiloxane endblocked at both molecular chain terminals with dimethylhydrogensiloxy groups, a dimethylpolysiloxane endblocked at both molecular chain terminals with dimethylhydrogensiloxy groups, and a mixture thereof.

* * * * *